(12) United States Patent
Nakabayashi et al.

(10) Patent No.: US 7,994,562 B2
(45) Date of Patent: Aug. 9, 2011

(54) MEMORY APPARATUS

(75) Inventors: Hajime Nakabayashi, Nirasaki (JP);
Yasushi Akasaka, Nirasaki (JP);
Tetsuya Shibata, Nirasaki (JP)

(73) Assignee: Tokyo Electron Limited (JP)

( * ) Notice: Subject to any disclaimer, the term of this patent is extended or adjusted under 35 U.S.C. 154(b) by 133 days.

(21) Appl. No.: 12/504,211

(22) Filed: Jul. 16, 2009

(65) Prior Publication Data

US 2010/0013000 A1    Jan. 21, 2010

(30) Foreign Application Priority Data

Jul. 16, 2008 (JP) ................................ 2008-184786

(51) Int. Cl.
*H01L 29/04* (2006.01)
(52) U.S. Cl. ................ 257/310; 257/E29.3; 257/E21.28
(58) Field of Classification Search .................. 438/452, 438/585, 591; 257/310, 324, E29.3, 213, 257/288, E21.28
See application file for complete search history.

(56) References Cited

U.S. PATENT DOCUMENTS

2005/0093054 A1 * 5/2005 Jung ............................ 257/310

FOREIGN PATENT DOCUMENTS

| JP | 2001-358237 | 12/2001 |
|---|---|---|
| JP | 2002-280467 | 9/2002 |
| JP | 2003-068897 | 3/2003 |
| JP | 2004-336044 | 11/2004 |
| JP | 2005-005715 | 1/2005 |
| JP | 2009-081316 | 4/2009 |
| KR | 10-2006-0104717 | 10/2006 |
| KR | 10-2008-0060609 | 7/2008 |

OTHER PUBLICATIONS

Japanese Office Action—2008-184786 dated Jun. 1, 2010.
Notice of Preliminary Rejection issued by the Korean Intellectual Property Office on Mar. 14, 2011, citing KR10-2008-0060609 and KR10-2006-0104717.

* cited by examiner

*Primary Examiner* — Thomas L Dickey
*Assistant Examiner* — Nikolay Yushin
(74) *Attorney, Agent, or Firm* — Cantor Colburn LLP

(57) ABSTRACT

The memory apparatus includes a memory device including a gate insulating layer formed on a silicon substrate by sequentially stacking a tunnel oxide layer, a charge trap layer, and a block oxide layer in this order, on the silicon substrate. In addition, a gate electrode is formed on the gate insulating layer. The block oxide layer is formed by stacking a first block oxide layer and a second block oxide layer, wherein the first block oxide layer is adjacent to the charge trap layer and the second block oxide layer is adjacent to the gate electrode. The second block oxide layer is formed of a dielectric material having higher permittivity than that of the first block oxide layer and having higher electron affinity than that of the first block oxide layer.

6 Claims, 8 Drawing Sheets

PRIOR ART

PRIOR ART

MEMORY APPARATUS

CROSS-REFERENCE TO RELATED PATENT APPLICATIONS

This application claims the benefit of Japanese Patent Application No. 2008-184786, filed on Jul. 16, 2008, in the Japan Patent Office, the disclosure of which is incorporated herein in its entirety by reference.

BACKGROUND OF THE INVENTION

1. Field of the Invention

The present invention relates to a memory apparatus, and more particularly, to a memory apparatus including a memory device having a gate insulating layer formed by stacking a tunnel oxide layer, a charge trap layer, and a block oxide layer, and a gate electrode formed on the block oxide layer.

2. Description of the Related Art

Conventional memory apparatuses include a memory device having a gate insulating layer formed by stacking three layers, that is, a tunnel oxide layer, a charge trap layer, and a block oxide layer, and a gate electrode formed on the block oxide layer. Referring to FIG. 6, such a conventional memory apparatus including a silicon-oxide-nitride-oxide-silicon (SONOS) memory device includes a gate insulating layer 15 having a structure in which a tunnel oxide layer 12 that is formed as an oxide layer, a charge trap layer 13 that is formed as a nitride layer, and a block oxide layer 14 that is formed as an oxide layer, are sequentially stacked on a silicon (Si) substrate 11, and a polysilicon gate electrode 16 formed on the gate insulating layer 15 (i.e., see Patent Documents 1 & 2).

In a SONOS memory device, a silicon oxide layer ($SiO_2$ layer) or an alumina layer ($Al_2O_3$ layer) is used as a block oxide layer. The band structure of a memory apparatus including such a SONOS memory device is shown in FIG. 7.

[Patent Document 1]: Japanese Laid-Open Patent Publication No. 2001-358237

[Patent Document 2]: Japanese Laid-Open Patent Publication No. 2002-280467

In a conventional memory apparatus including a SONOS memory device, there is a problem that data erase speed is slow and a data erase operation is incomplete. This is because, when electrons accumulated in a charge trap layer are emitted toward a substrate by applying a high negative voltage to a gate electrode during a data erase operation, electrons are newly injected into the charge trap layer from the gate electrode.

FIG. 8 illustrates a band structure of a SONOS memory device when a negative voltage is applied to a gate electrode during a data erase operation. The structure of a SONOS model used in calculation of the band structure of FIG. 8 is constituted by:

gate electrode work function ($\Phi m$)=5 eV block oxide layer: $SiO_2$ layer, thickness of 7 nm charge trap layer: $Si_3N_4$ layer, thickness of 4 nm tunnel oxide layer: $SiO_2$ layer, thickness of 3.5 nm erase voltage (Vg−Vfb)=18 V Referring to FIG. 8, when the negative voltage is applied to the gate electrode, an insulating layer has a large gradient with respect to potential, and the height and thickness of a barrier wall seen from electrons accumulated on the gate electrode decrease. The block oxide layer is a barrier wall that suppresses injection of electrons from the gate electrode, but in a conventional SONOS memory device including a block oxide layer formed of a silicon oxide layer or alumina, electron injection is not sufficiently suppressed.

SUMMARY OF THE INVENTION

To solve the above and/or other problems, the present invention provides a memory apparatus in which suppression of electron injection using a block oxide layer is improved so that data erase speed is improved and a data erase operation is securely performed.

According to an aspect of the present invention, there is provided a memory apparatus including a memory device, wherein the memory device includes: a gate insulating layer formed by stacking a tunnel oxide layer, a charge trap layer, and a block oxide layer in this order; and a gate electrode formed on the block oxide layer, and wherein the block oxide layer has a gradient with respect to the material composition thereof or has a stacked structure.

A surface of the block oxide layer that is adjacent to the gate electrode may have higher electron affinity and higher permittivity than those of a surface of the block oxide layer that is adjacent to the charge trap layer.

The stacked structure of the block oxide layer may include a first block oxide layer disposed adjacent to the charge trap layer, and a second block oxide layer disposed adjacent to the gate electrode, wherein the second block oxide layer is formed of a dielectric material having higher electron affinity than that of the first block oxide layer and having higher permittivity than that of the first block oxide layer.

The first block oxide layer may include $SiO_2$ or $Al_2O_3$, and the second block oxide layer may include a binary metal oxide, a silicate material, or an aluminate material.

The second block oxide layer may include one selected from the group consisting of $HfO_2$, $ZrO_2$, $La_2O_3$, HfSiO, HfSiON, HfAlO, and $LaAlO_3$.

The first block oxide layer may include $Al_2O_3$, and the second block oxide layer may include $ZrO_2$, and the thickness of the first block oxide layer may be equal to or greater than about 2 nm and equal to or less than about 10 nm.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
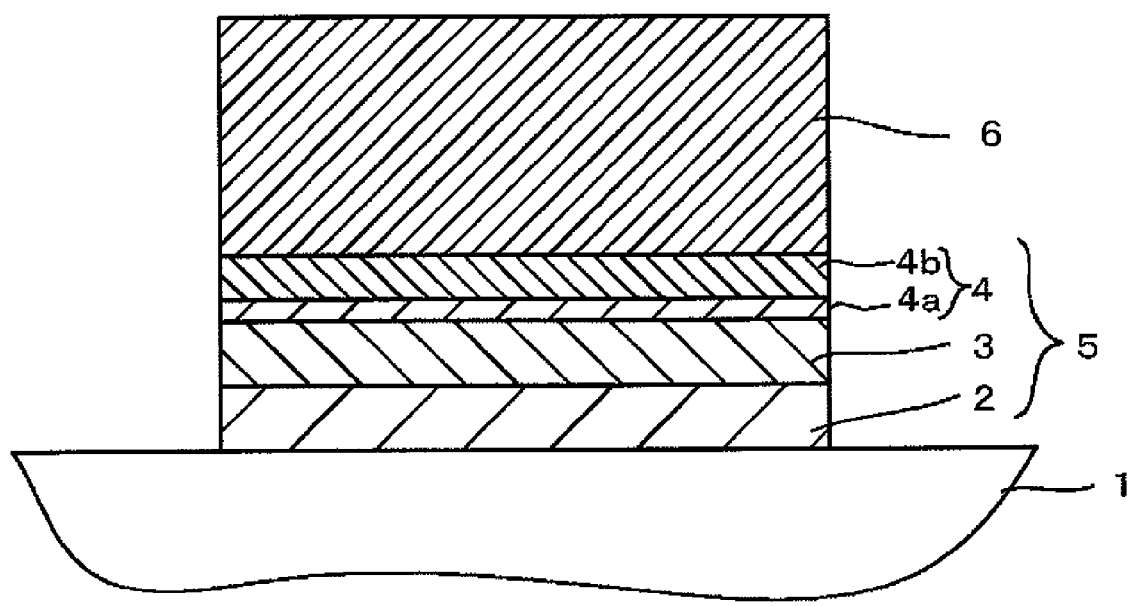
FIG. 1 is a sectional view of main elements of a memory device of a memory apparatus according to an embodiment of the present invention.

The attached drawings for illustrating exemplary embodiments of the present invention are referred to in order to gain a sufficient understanding of the present invention, the merits thereof, and the objectives accomplished by the implementation of the present invention. Hereinafter, the present invention will be described in detail by explaining exemplary embodiments of the invention with reference to the attached drawings. Like reference numerals in the drawings denote like elements.

FIG. 1 is a sectional view of main elements of a memory device of a memory apparatus according to an embodiment of the present invention. Referring to FIG. 1, the memory device includes a gate insulating layer 5 formed on a silicon substrate 1 by sequentially stacking three layers, that is, a tunnel oxide layer 2, a charge trap layer 3, and a block oxide layer 4, on the silicon substrate 1. In addition, a gate electrode 6 is formed on the gate insulating layer 5.

The tunnel oxide layer 2 is formed of oxide layer (e.g., $SiO_2$ in this embodiment), and the charge trap layer 3 is formed of nitride layer (e.g., $Si_3N_4$ in this embodiment). In addition, the gate electrode 6 is formed of polysilicon.

In the present embodiment, the block oxide layer 4 is formed by stacking a first block oxide layer 4a and a second block oxide layer 4b, such that the first block oxide layer 4a is adjacent to the charge trap layer 3 and the second block oxide layer 4b is adjacent to the gate electrode 6. The second block oxide layer 4b, which is adjacent to the gate electrode 6, is formed of a dielectric material having higher permittivity than that of the first block oxide layer 4a and having higher electron affinity than that of the first block oxide layer 4a. In other words, the first block oxide layer 4a, which is adjacent to the charge trap layer 3, is formed of a dielectric material having lower permittivity than that of the second block oxide layer 4b and having lower electron affinity than that of the second block oxide layer 4b.

As described above, the second block oxide layer 4b formed of a dielectric material having higher permittivity than that of the first block oxide layer 4a and having higher electron affinity than that of the first block oxide layer 4a, is disposed adjacent to the gate electrode 6, and the first block oxide layer 4a formed of a dielectric material having lower permittivity than that of the second block oxide layer 4a and having lower electron affinity than that of the second block oxide layer 4a, is disposed adjacent to the charge trap layer 3, so that a barrier wall with regard to the electron injection from the gate electrode 6 during a data erase operation may become high.

Silicon oxide ($SiO_2$) or alumina ($Al_2O_3$) may be used as the dielectric material having relatively low permittivity and relatively low electron affinity. In addition, a binary metal oxide such as $HfO_2$, $ZrO_2$, or $La_2O_3$, a silicate material such as HfSiO or HfSiON, or an aluminate material such as HfAlO may be used as the dielectric material having relatively high permittivity and relatively high electron affinity.

In the present embodiment, the first block oxide layer 4a is formed of $Al_2O_3$, and the thickness of the first block oxide layer 4a is less than that of the second block oxide layer 4b. The thickness of the first block oxide layer 4a may be about 2 nm to about 10 nm, and in the present embodiment, the thickness of the first block oxide layer 4a is about 6 nm. (The reason why the thickness of the first block oxide layer 4a is about 6 nm will be described later in detail.) In addition, the ideal physical property of $Al_2O_3$ layer is an electron affinity X of about 1.2 eV and a relative permittivity ∈ of about 9.4.

In the present embodiment, the second block oxide layer 4b is formed of $ZrO_2$, and the thickness of the second block oxide layer 4b is about 35 nm. The reason why the thickness of the second block oxide layer 4b is about 35 nm is that the equivalent oxide thickness (EOT) of the block oxide layer 4 needs to be about 7 nm, thus, when the thickness of the first block oxide layer 4a is about 6 nm, the thickness of the second block oxide layer 4b needs to be about 35 nm. In addition, the ideal physical property of $ZrO_2$ layer is an electron affinity X of about 2.6 eV and a relative permittivity ∈ of about 30.

As described above, in the present embodiment, the second block oxide layer 4b having relatively high permittivity and relatively high electron affinity is used so that the thickness of the barrier wall during a data erase operation may be large. Thus, leakage of electrons due to a modified FN (MFN) tunnel from the gate electrode 6 to the charge trap layer 3 may be suppressed, leakage of electrons from the gate electrode 6 to the charge trap layer 3 may be transited to thermal emission (TE) control from the MFN tunnel, and leakage of electrons from the gate electrode 6 to the charge trap layer 3 may be greatly suppressed.

Figure 2:
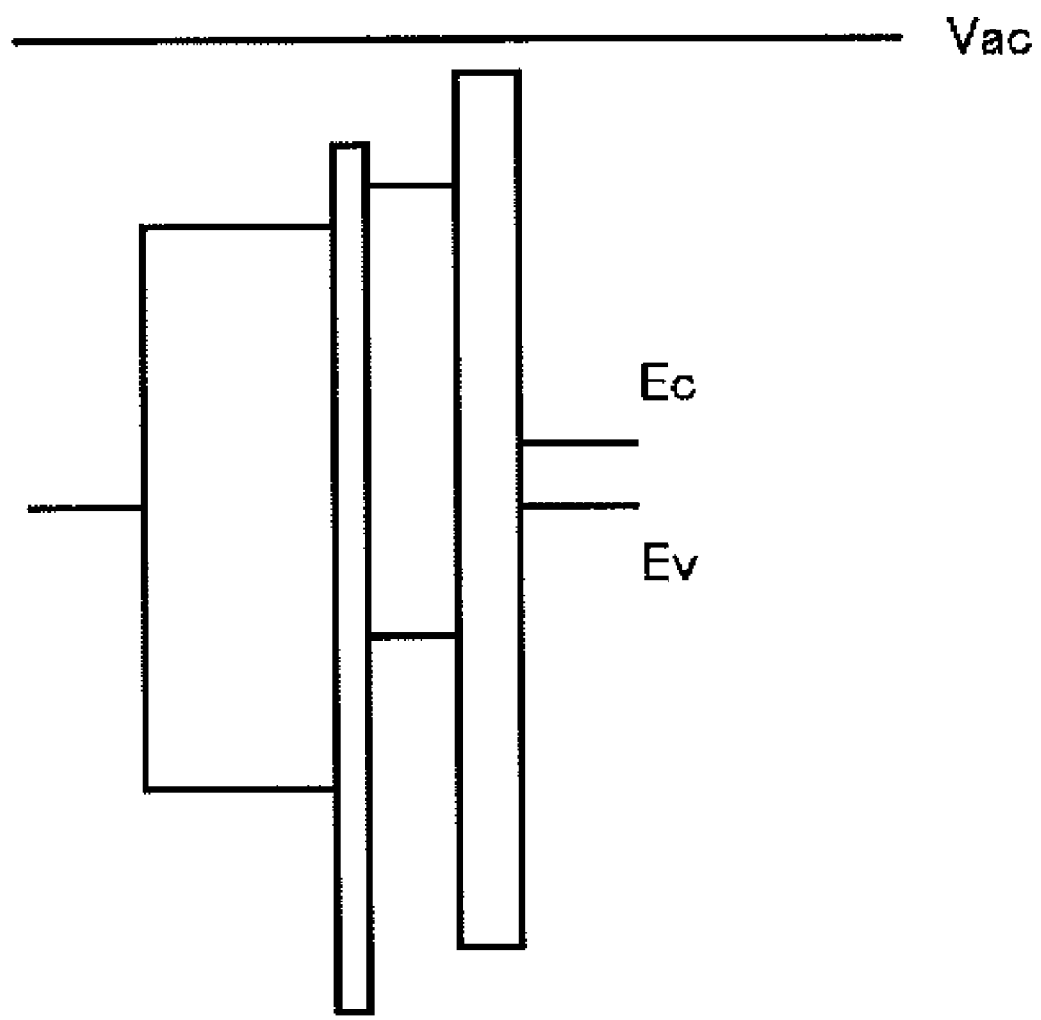
FIG. 2 illustrates a band structure of the memory apparatus of FIG. 1, according to an embodiment of the present invention.

In addition, the height of the barrier wall is not high enough only with the second block oxide layer 4b, so the height of the barrier wall is increased by forming the first block oxide layer 4a having lower electron affinity than the second block oxide layer 4b. Thus, leakage of electrons from the gate electrode 6 to the charge trap layer 3 due to thermal emission (TE) during the data erase operation may be suppressed, and leakage of electrons from the charge trap layer 3 to the gate electrode 6 during a data sustain operation may be suppressed. FIG. 2 illustrates a band structure according to the present embodiment.

Figure 3:
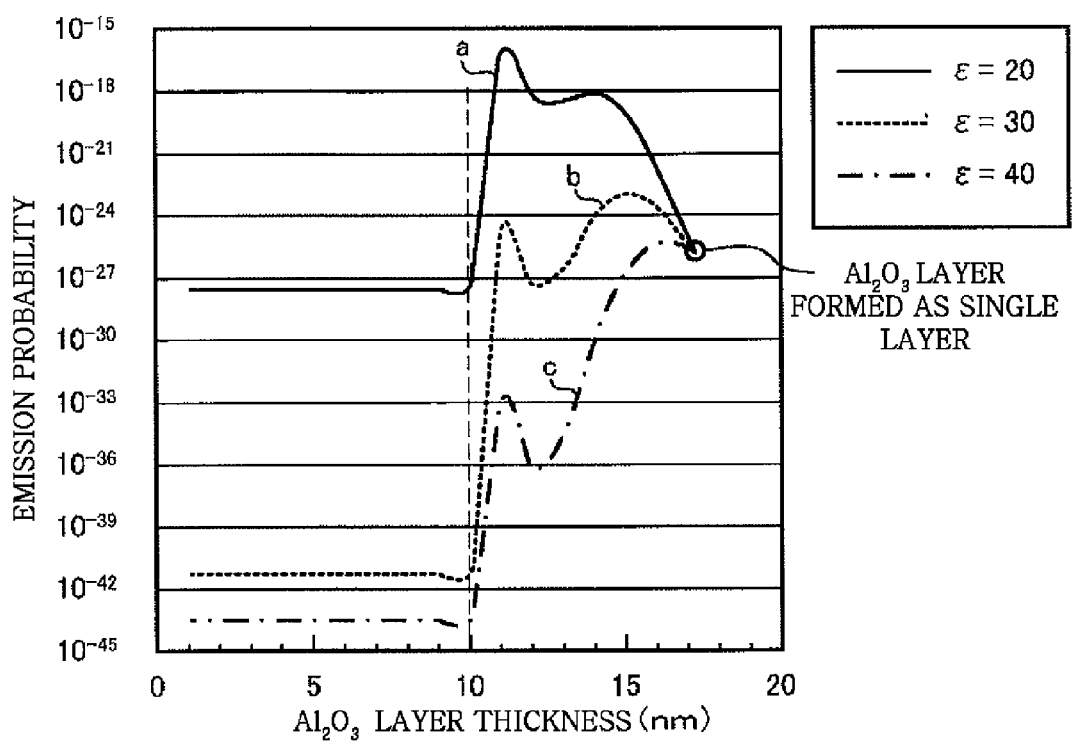
FIG. 3 is a graph showing an emission probability of electrons and the thickness of an $Al_2O_3$ layer during a data erase operation.

In order to transit leakage of electrons from the gate electrode 6 to the charge trap layer 3 to TE control from the MFN tunnel, as described above, the thickness of the second block oxide layer 4b having high relative permittivity and high electron affinity needs to be made large, and thus, the thickness of the first block oxide layer 4a needs to be made small. FIG. 3 is a graph showing the result of simulation of the relationship between an emission probability of electrons injected from the gate electrode 6 via the block oxide layer 4 into the charge trap layer 3 and the thickness of the first block oxide layer 4a which is formed as an $Al_2O_3$ layer. In FIG. 3, the vertical axis represents the emission probability of electrons, the horizontal axis represents the thickness of the $Al_2O_3$ layer, the relative permittivity (∈) of a $ZrO_2$ layer is 20 (curve a), 30 (curve b), and 40 (curve c) and a voltage (Vg–Vfb) of –18 V is applied to the gate electrode 6 during a data erase operation. In addition, in FIG. 3, the case when the thickness of the $Al_2O_3$ layer is about 17 nm represents the case when only the $Al_2O_3$ layer is formed as a block oxide layer.

As shown in FIG. 3, in order to transit leakage of electrons from the gate electrode 6 to the charge trap layer 3 to TE control from the MFN tunnel, the thickness of the $Al_2O_3$ layer needs to be equal to or less than about 10 nm. In the above structure, when the relative permittivity ∈ of the $ZrO_2$ layer is 20, the effect of reducing the emission probability of electrons is about ¹⁄₁₀₀ as compared to the case when the $Al_2O_3$ layer is formed as a single layer. In addition, when the relative permittivity ∈ of the $ZrO_2$ layer is 30, the emission probability of electrons is greatly reduced.

Figure 4:
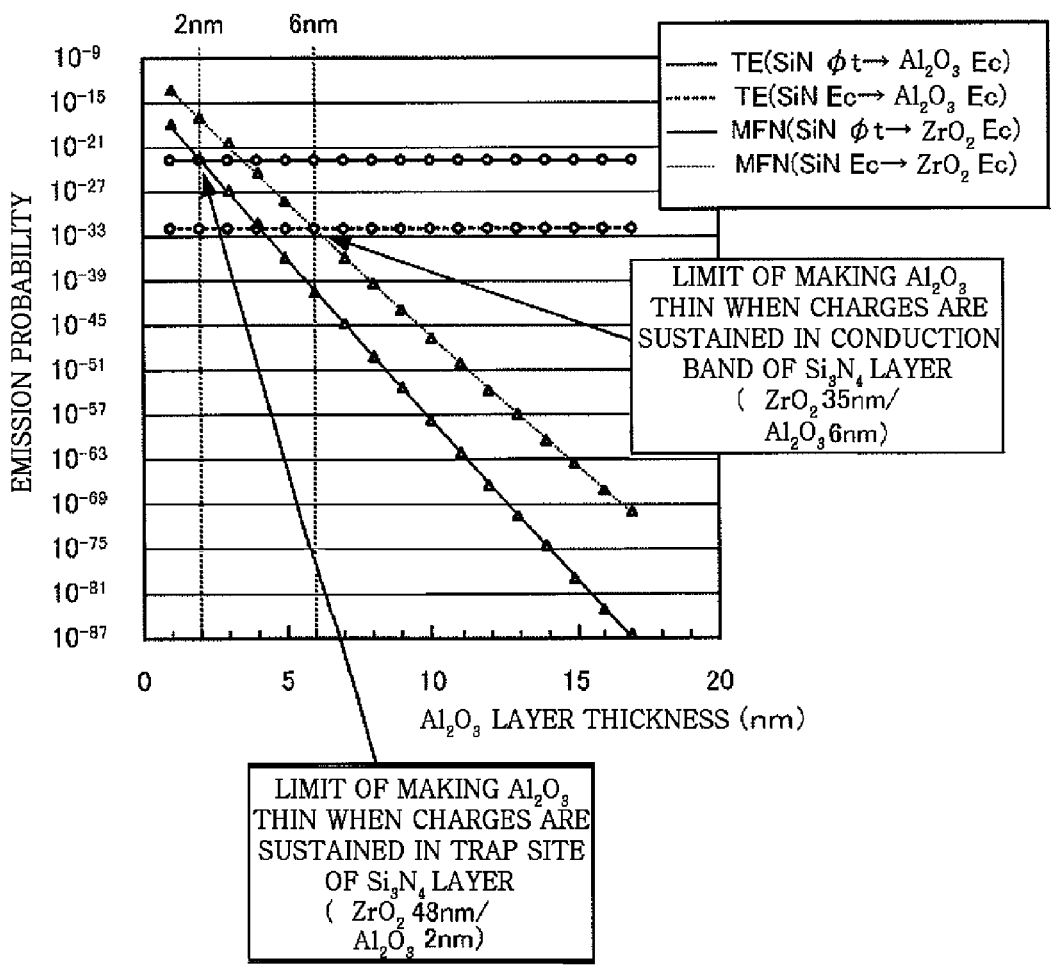
FIG. 4 is a graph showing an emission probability of electrons and the thickness of an $Al_2O_3$ layer during a data sustain operation.

FIG. 4 is a graph showing the result of simulation of a leakage characteristic of electrons during a data sustain operation in the block oxide layer 4 formed by stacking the second block oxide layer 4b formed of $ZrO_2$ and the first block oxide layer 4a formed of $Al_2O_3$, wherein the vertical axis represents an emission probability of electrons and the horizontal axis represents the thickness of the $Al_2O_3$ layer (the first block oxide layer 4a). In other words, FIG. 4 shows an emission probability that electrons trapped in the charge trap layer 3 during the data sustain operation leak from the gate electrode 6 via the block oxide layer 4. In addition, the result of the case when the relative permittivity ∈ of the $ZrO_2$ layer is 30 is shown in FIG. 4.

As shown in FIG. 4, the emission probability due to TE is constant because the height of the barrier wall formed by the $Al_2O_3$ layer seen from a conduction band and a trap site of a $Si_3N_4$ layer constituting the charge trap layer 3 does not vary. As the thickness of the $ZrO_2$ layer (the second block oxide layer 4b) of the block oxide layer 4 increases and the thickness of the $Al_2O_3$ layer (the first block oxide layer 4a) decreases, the probability of MFN tunneling in the $Si_3N_4$ layer and the $Al_2O_3$ layer increases.

When electrons injected during a cell write operation are accumulated in the conduction band of the $Si_3N_4$ layer, if the $Al_2O_3$ layer is made thin to be equal to or less than about 6 nm, a leakage characteristic of electrons is deteriorated as compared to the block oxide layer 4 that is formed as a single $Al_2O_3$ layer (in the case of MFN (SiN Ec→$ZrO_2$ Ec) indicated by a dotted line of FIG. 4). In addition, when the accumulated electrons exist in the trap site (depth ($\Phi t$) from the conduction band=0.7 eV) of the $Si_3N_4$ layer, the limit of making the $Al_2O_3$ layer thin is about 2 nm (in the case of MFN (SiN $\Phi t$→$ZrO_2$ Ec) indicated by a solid line of FIG. 4).

For the above reasons, the thickness of the first block oxide layer 4a which is formed of $Al_2O_3$, may be equal to or greater than about 2 nm and equal to or less than about 10 nm, preferably, equal to or greater than about 6 nm and equal to or less than about 8 nm.

In addition, in the present embodiment, the second block oxide layer 4b is formed of $ZrO_2$. However, even when the second block oxide layer 4b is formed of another material with high permittivity, for example, a binary metal oxide such as $HfO_2$, $ZrO_2$, or $La_2O_3$, a silicate material such as HfSiO or HfSiON, or an aluminate material such as HfAlO or $LaAlO_3$, like in the present embodiment, the thickness of the first block oxide layer 4a is made small, and the thickness of the second block oxide layer 4b is made large.

Figure 5:
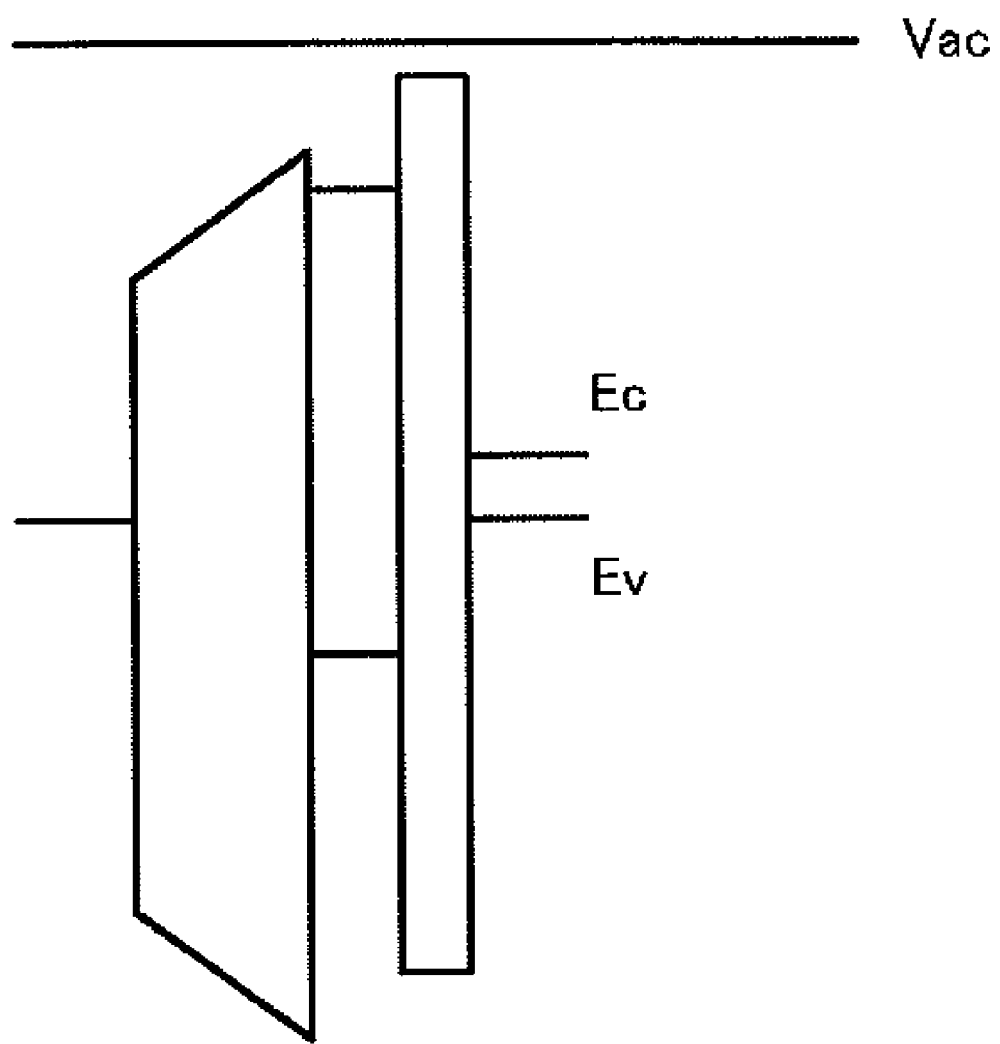
FIG. 5 illustrates a band structure of the memory apparatus of FIG. 1, according to another embodiment of the present invention.
Figure 6:
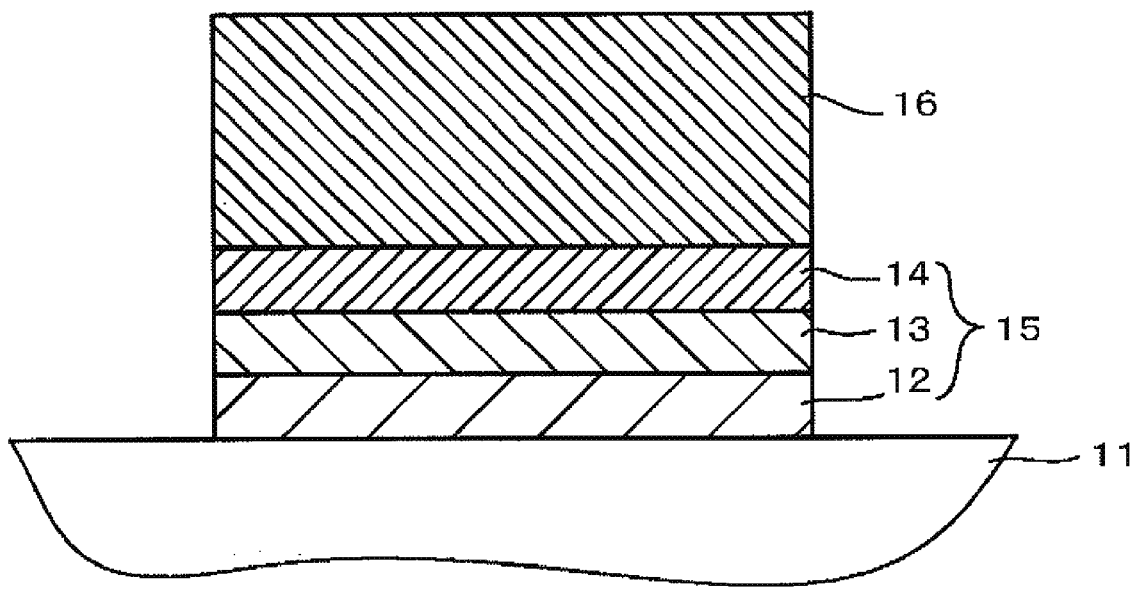
FIG. 6 is a sectional view of main elements of a memory device of a conventional memory apparatus.
Figure 7:
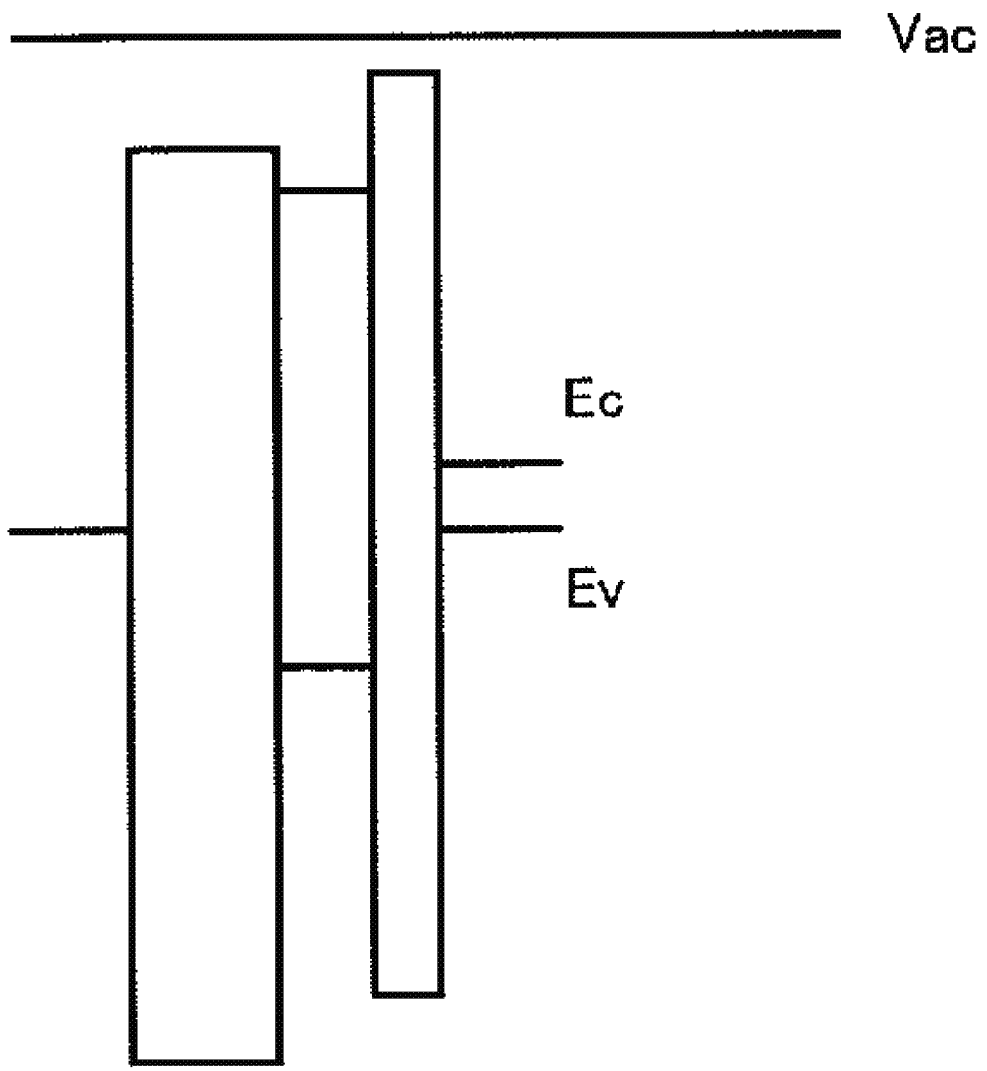
FIG. 7 illustrates a band structure of the conventional memory apparatus of FIG. 6.
Figure 8:
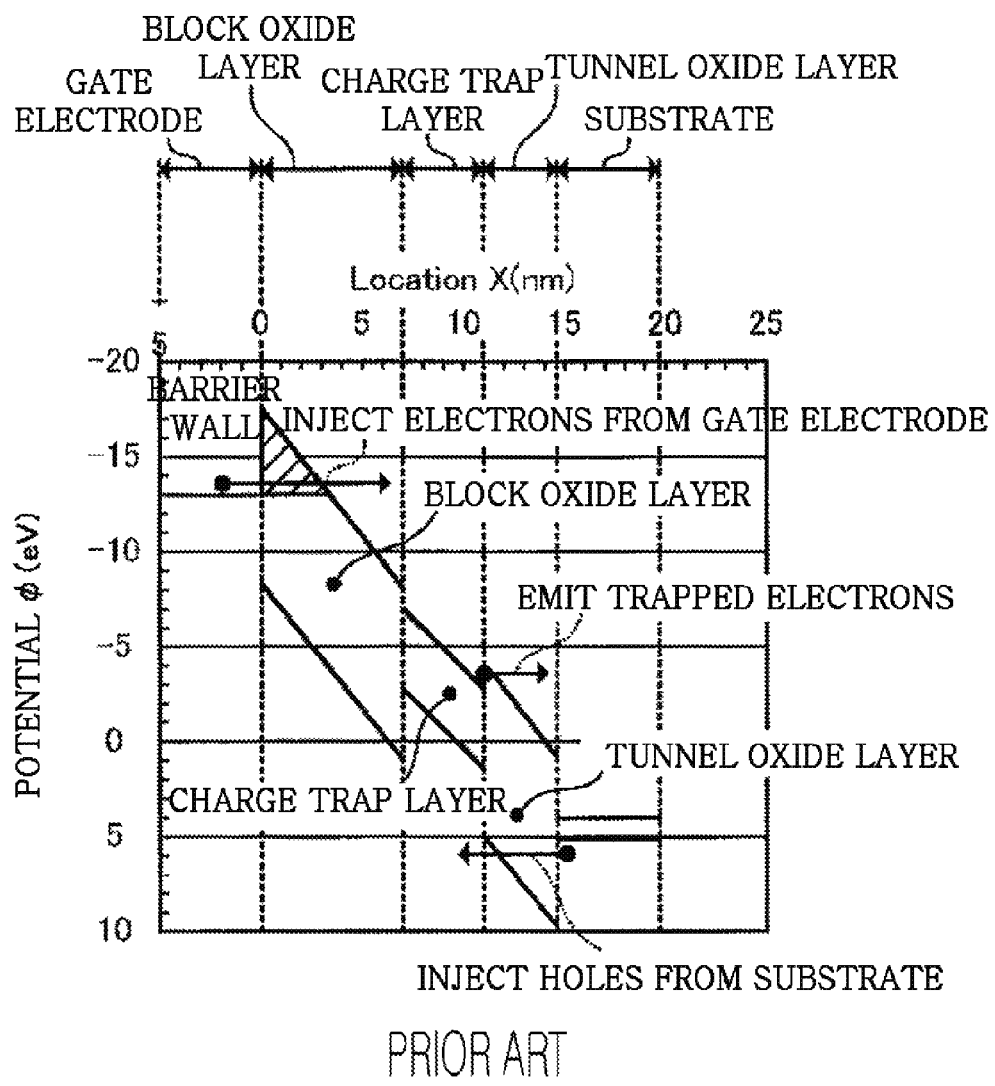
FIG. 8 illustrates a band structure of the conventional memory apparatus of FIG. 6.

In addition, in the present embodiment, the block oxide layer 4 has a structure in which the first block oxide layer 4a and the second block oxide layer 4b are stacked; however, the block oxide layer 4 may have a structure in which a material used to form the first block oxide layer 4a and a material used to form the second block oxide layer 4b are mixed (a gradient is formed with respect to material composition) at an interface between the first block oxide layer 4a and the second block oxide layer 4b. In addition, the block oxide layer 4 may have a structure in which the block oxide layer 4 is not formed to have a two-layered stack structure. Instead, the block oxide layer 4 may be formed to have a gradient with respect to the material composition in the thickness direction of the block oxide layer 4 and to have a gradient with respect to electron affinity and permittivity so as to have higher electron affinity and higher permittivity with respect to the gate electrode 6 than to the block oxide layer 4. The band structure in this case is shown in FIG. 5.

As described above, in the memory apparatus according to the present invention, suppression of electron injection using a block oxide layer is improved so that data erase speed may be improved and a data erase operation may be securely performed.

While this invention has been particularly shown and described with reference to exemplary embodiments thereof, it will be understood by those of ordinary skill in the art that various changes in form and details may be made therein without departing from the spirit and scope of the invention as defined by the appended claims.

What is claimed is:

1. A memory apparatus comprising a memory device, wherein the memory device comprises:
   a gate insulating layer formed by stacking a tunnel oxide layer, a charge trap layer, and a block oxide layer in this order; and
   a gate electrode formed on the block oxide layer, and
   wherein the block oxide layer has a stacked structure,
   the stacked structure of the block oxide layer comprises a first block oxide layer disposed adjacent to the charge trap layer, and a second block oxide layer disposed adjacent to the gate electrode, wherein the second block oxide layer is formed of a dielectric material having higher electron affinity than that of the first block oxide layer and having higher permittivity than that of the first block oxide layer, and
   the thickness of the first block oxide layer is equal to or greater than about 6 nm and equal to or less than about 10 nm.

2. The memory apparatus of claim 1, wherein the first block oxide layer comprises $Al_2O_3$, and the second block oxide layer comprises $ZrO_2$.

3. The memory apparatus of claim 1, wherein the first block oxide layer comprises $Al_2O_3$, and the second block oxide layer comprises $HfO_2$.

4. The memory apparatus of claim 1, wherein the first block oxide layer comprises $SiO_2$ or $Al_2O_3$ and the second block oxide layer comprises a binary metal oxide, a silicate material, or an aluminate material.

5. The memory apparatus of claim 4, wherein the second block oxide layer comprises one selected from the group consisting of $HfO_2$, $ZrO_2$, $La_2O_3$, HfSiO, HfSiON, HfAlO, and $LaAlO_3$.

6. A memory apparatus comprising a memory device, wherein the memory device comprises:
   a gate insulating layer formed by stacking a tunnel oxide layer, a charge trap layer, and a block oxide layer in this order; and
   a gate electrode formed on the block oxide layer, and
   wherein the block oxide layer has a continuous gradient with respect to the material composition thereof in a thickness direction of the block oxide layer, and
   a surface of the block oxide layer that is adjacent to the gate electrode has higher electron affinity and higher permittivity than those of a surface of the block oxide layer that is adjacent to the charge trap layer.

* * * * *